US006851939B2

(12) United States Patent
Lee et al.

(10) Patent No.: US 6,851,939 B2
(45) Date of Patent: Feb. 8, 2005

(54) SYSTEM FOR CHEMICAL VAPOR DEPOSITION AT AMBIENT TEMPERATURE USING ELECTRON CYCLOTRON RESONANCE AND METHOD FOR DEPOSITING METAL COMPOSITE FILM USING THE SAME

(75) Inventors: Joong-Kee Lee, Seoul (KR); Dal-Keun Park, Seoul (KR); Byung-Won Cho, Seoul (KR); Joo-Man Woo, Seoul (KR); Bup-Ju Jeon, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/124,057

(22) Filed: Apr. 17, 2002

(65) Prior Publication Data

US 2003/0000827 A1 Jan. 2, 2003

(30) Foreign Application Priority Data

Apr. 23, 2001 (KR) ........................................ 2001-21711

(51) Int. Cl.[7] .......................... H05H 1/46; C23C 16/00
(52) U.S. Cl. ...................... 417/569; 427/575; 427/576; 427/577; 118/723 MR; 118/728
(58) Field of Search ................................ 427/569, 570, 427/571, 575, 576, 577, 578; 118/723 MR, 723 MA, 723 ME, 723 MW, 728, 715, 726; 204/298.04, 298.01, 192.1, 192.11, 192.12; 315/111.31, 111.41, 111.61, 111.71

(56) References Cited

U.S. PATENT DOCUMENTS

| 4,795,529 A | * | 1/1989 | Kawasaki et al. ............. 216/37 |
| 4,831,963 A | * | 5/1989 | Saito et al. .......... 118/723 MR |
| 5,279,866 A | * | 1/1994 | Bourget et al. .............. 427/575 |
| 5,312,783 A | * | 5/1994 | Takasaki et al. ............ 438/785 |
| 6,156,164 A | * | 12/2000 | Smolanoff et al. ...... 204/192.12 |
| 6,214,183 B1 | | 4/2001 | Maishev et al. |
| 2003/0026921 A1 | * | 2/2003 | Ueno et al. .................. 427/595 |

* cited by examiner

*Primary Examiner*—Parviz Hassanzadeh
(74) *Attorney, Agent, or Firm*—Scully, Scott, Murphy & Presser

(57) ABSTRACT

A system for chemical vapor deposition at ambient temperature using electron cyclotron resonance (ECR) comprising: an ECR system; a sputtering system for providing the ECR system with metal ion; an organic material supply system for providing organic material of gas or liquid phase; and a DC bias system for inducing the metal ion and the radical ion on a substrate is provided, and a method for fabricating metal composite film comprising: a step of providing a process chamber with the gas as plasma form using the ECR; a step of providing the chamber with the metal ion and the organic material; a step of generating organic material ion and radical ion by reacting the metal ion and the organic material with the plasma; and a step of chemically compounding the organic material ion and the radical ion after inducing them on a surface of a specimen is also provided.

8 Claims, 4 Drawing Sheets

SYSTEM FOR CHEMICAL VAPOR DEPOSITION AT AMBIENT TEMPERATURE USING ELECTRON CYCLOTRON RESONANCE AND METHOD FOR DEPOSITING METAL COMPOSITE FILM USING THE SAME

BACKGROUND OF THE INVENTION

1. Field of the Invention

The present invention relates to a system for chemical vapor deposition at ambient temperature using electron cyclotron resonance (ECR) and a method for depositing metal composite film using the same.

2. Description of the Background Art

Generally, there are conventional methods such as an ion beam deposition, a sputter deposition, and a thermal evaporation for forming metal film.

In the ion beam deposition method, a metal is vaporized in a tungsten filament crucible furnace. The metal vapor spouted outward by thermoionic impact forms molecular form or a cluster, and then ionized in an electromagnetic field. The ions are accelerated by an particle accelerator to be impacted on a substrate, and thereby a film is formed.

A film formation mechanism comprises a cluster formation, a nucleation process, and an ad-atom migration. The ion energy in the ion beam ranges largely as eV~MeV. In addition, the ion energy can be divided into a high energy (MeV), a narrow energy (hundreds of keV~tens of keV), and a broad beam (hundreds of eV~a few eV) according to the energy range.

The high energy and the narrow beam having high ion energy are generally used for forming a buried layer of an inorganic film, surface modification, ion injection, or for physical deposition. However, these have high ion energy, and therefore, circumferential temperature rises when the ions are impacted to the substrate to generate many defects, and roughness of an interface and a surface are increased greatly.

The broad beam is usually used for the physical deposition, and the physical vapor deposition can be divided into an ion vapor deposition (IVD), and an ion cluster beam (ICB) according to an ion assisted deposition (IAD) method. The IVD deposits the metal physically as activating the substrate using vapor atom, and the ICB makes the material, which will be deposited, an atom or an ion cluster, and deposits directly by adding energy.

The physical vapor deposition by the ion beam can perform the deposition rapidly and can perform a metal composite film if a plurality of furnaces are used. However, it has some disadvantages as follows.

1) It is difficult to control an amount and a composition of metal included in the film according to a pressure condition in a reactor because the metal is vaporized.
2) Fusion points are different from the kind of the metal, the vaporization speed is differentiated by the temperature in the furnace, and therefore, the metal source which can be used is limited. Also, it is difficult to apply in a successive processes due to the limited size of the furnace.
3) Even in case of the broad beam having lower energy, it is difficult to enlarge due to the problems caused by the focusing of the metal ion.
4) The circumferential temperature is risen by the impact between the accelerated ion of high energy and the substrate to generate many defects, and thereby an interfacial adhesion force is weak and the film is degraded as the time goes by.
5) in case that the substrate is an organic material such as a polymer, the material may be distorted or the physical property of the material may be changed during the process.

On the other hand, a physical vapor deposition method by a sputter is a technique which etches a metal target using microwave, RF plasma, and DC discharge and physically deposits the ionized metal target on the substrate.

The above technique can deposit simply and rapidly, however, the interface damage is increased and defects are formed on the film, and thereby a mechanical strength or adhesion force between the interfaces is lowered. In addition, the bounding energy is greatly lowered on an upper part of the film because the composition of the film is constituted only of the adhesion of the metal.

A principle of the thermal evaporation is simple, that is, the metal, the compound, or the alloy is heated in a vacuum state to be evaporated from the fusion state, and the evaporated particles are deposited on the substrate. The above method is different from the sputtering method in a point that the evaporation process is the heat exchanging process. The thin film made by the above method is called as vacuum thermal evaporation thin film. Advantages of the vacuum deposition method are as follows. First, a structure of device is relatively simple, second, the vacuum deposition method can be applied to many materials, third, a core growth or thin film growth theory can be easily applied to form the thin film because the thin film formation mechanism is relatively simple, and fourth, it is suitable for in-situ observation of the thin film in forming the thin film because the above method is thermally and electrically simple. Also, fifth, a material having different crystal structure from that of the material of thermodynamical equilibrium or a compound having different composition can be made. However, the above method can be used usually for depositing the material having lower fusion point, there is a limit in the material for evaporation considering the vapor pressure, and the adhesion force of the thin film which is made similarly to the sputtered film is low.

Therefore, in order to maximize the advantages of the vacuum deposition, devices in which the ion beam method and the sputtering method is combined are developed (U.S. Pat. No. 6,214,183). In above device, the ion beam is radiated to a magnetron target to generate a large amount of sputtered particles and secondary ions. However, according to the above device, the ion beam is used only for increasing the function of the sputter, and the fundamental characteristic of the thin film can not be changed.

As described above, in the conventional deposition methods, the characteristic of the deposited film is inferior, and especially, it is not convenient for changing the characteristic of the film. Also, there are some problems such that the deposition is made in high temperature, or the substrate is damaged physically.

SUMMARY OF THE INVENTION

Therefore, an object of the present invention is to provide a deposition system for forming deposition film of high quality on which adhesion force between a substrate and a metal film deposited on the substrate is superior, and a deposition method.

Another object of the present invention is to provide a method which can change conductivity freely without changing physical property of substrate such as degradation and distortion regardless of object materials of coating such as paper, fiber, or engineering polymer resin.

Still another object of the present invention is to provide a method for forming multicomponent metal film caused by a chemical vapor deposition at ambient temperature by installing a plurality of sputter guns or providing various kinds of organometalic compounds.

Another object of the present invention is to provide a method for changing composition of metal film or changing a specific resistance characteristic within $10^{-1} \sim 10^{10} \Omega$ freely by controlling processing variables such as shielding gas composition, sputtering speed controlling, or pressure controlling.

Still another object of the present invention is to provide a method for forming film at high speed and for coating metal film of larger area successively on a sheet or solid specimen having a width larger than 1 m.

To achieve these and other advantages and in accordance with the purpose of the present invention, as embodied and broadly described herein, there is provided a deposition system at ambient temperature using an electron cyclotron resonance (ECR) comprising: a process chamber for providing a reaction environment in which metal ion and radical ion are deposited on a substrate; a substrate, on which the metal ion and the radical ion are deposited, installed in the process chamber; an ECR system connected to the process chamber for providing plasma; an organic material supply system for providing the process chamber with organic material; a sputtering system for providing the process chamber with the metal ion; an inducing system for providing a specimen mounted on the substrate with induced voltage which induces the metal ion and the radical ion; a grid installed around the substrate for inducing the metal ion and the radical ion to the specimen by being applied the voltage provided from the inducing system; and a vacuum system connected to the process chamber for controlling an inner vacuumed degree.

Also, there is provided a method for fabricating a metal composite film comprising: a step of forming gases such as hydrogen, argon, or nitrogen into plasma and providing the process chamber with the plasma from the ECR system using the ECR system in which the plasma is formed using the ECR and using the sputtering system for providing the metal ion; a step of providing the process chamber with the organic material and the metal ion from the sputter system; a step of generating organic material ion and radical ion by reacting the metal ion and the organic material with the plasma; and a step of inducing and chemically compounding the organic material ion and the radical ion on the surface of the specimen by a DC bias.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
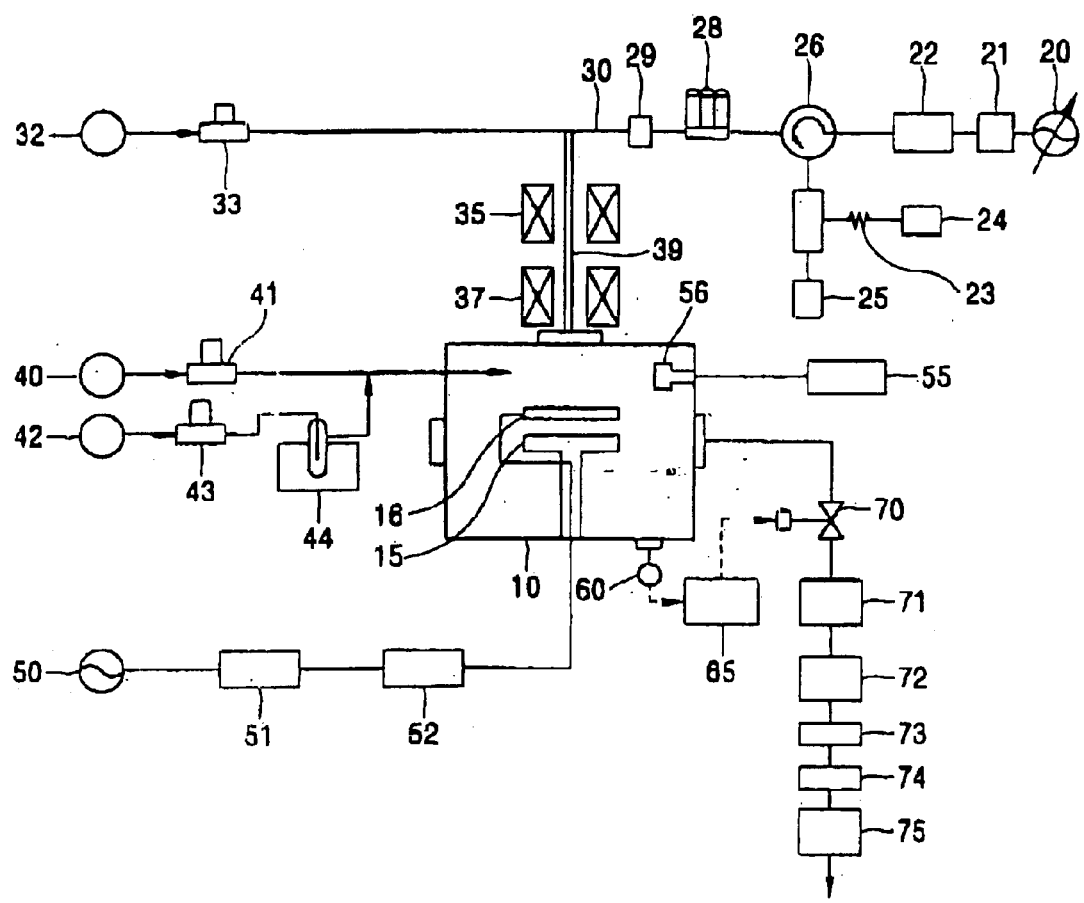
FIG. 1 is a block diagram showing a structure of a chemical vapor deposition system at ambient temperature in which ECR and sputter are compounded according to the present invention.
Figure 2:
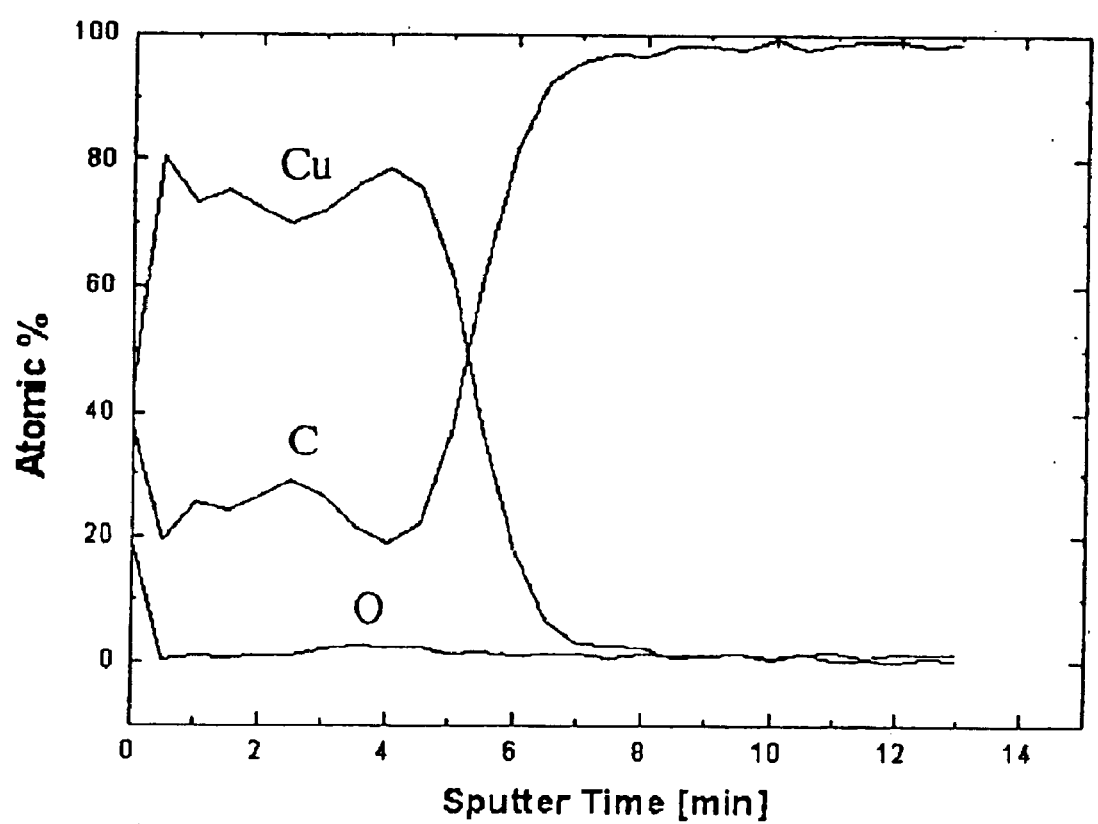
FIG. 2 is a graph showing an Auger characteristic of copper metal thin film fabricated by an ECR/sputter compounded type chemical deposition method at ambient temperature according to the present invention.

Reference will now be made in detail to the preferred embodiments of the present invention, examples of which are illustrated in the accompanying drawings.

A high density plasma ion of gas molecule such as hydrogen, nitrogen, or argon is generated using an ECR plasma which is generated when a rotation frequency caused by a magnetic field of an electron and a frequency of microwave caused by the power source are coincided with each other.

The generated plasma ionizes a metal organic compounds or metal vapor which are provided separately, or radically ionizes the metal located on a plasma etching zone.

In addition, the ionized metal and the organic materials are induced onto the substrate using voltage between 1~100 kV applied around the substrate.

The method for forming metal thin film according to the present invention can be divided into following three methods.

1) the organo-metallic compounds is provided and disassembled into the metal the organic material using the plasma generated by the ECR, respective metal and the organic material are changed into the radicals, and a metal film is deposited on the substrate by the inducement of the pulsed DC bias.

2) the metal is located on the plasma etching zone generated by the ECR, and aromatic and hydrocarbon organic material are provided independently toward a lower part of the etching zone to generate metal radical in the plasma etching zone. In addition, the provided organic materials are changed into the radicals by the plasma, and the metal film is deposited on the surface of the substrate by the DC bias inducing.

3) the sputter is installed on a lower part of the plasma generated by the ECR to provide the metal vapor, and the aromatic and hydrocarbon organic materials are provided separately to form ionized radicals by the effect of the plasma. In addition, the metal film is deposited on the surface of the substrate by the inducing of the pulsed DC bias.

When negative DC high voltage or RF pulse voltage of 1~100 kV range is applied around the substrate as the organic material which is the reactive gas is supplied around the depositing area, the plasma ion of high energy impacts the metal ion and the organic material in the reaction area to be ionized or to generate hydrocarbon radical, and thereby the metal composite film is formed in an ambient temperature by the chemical compounding between the metal ions on the substrate.

The ECR system according to the present invention comprises: a generator for generating microwave; a gas supply unit for supplying gas for generating plasma; an ECR chamber in which the plasma is formed by the ECR; at least one magnet mounted on the ECR chamber for forming a magnetic field; a waveguide for providing the ECR chamber with the microwave; and an impedance matching unit connected to the waveguide between the ECR chamber and the generator for impedance matching. In addition, the gas provided through the gas supply unit is one of oxidized, deoxidized, and inert gas.

The ECR chamber includes an inner chamber made using quartz which is mounted for preventing the plasma from being contaminated by impurities attached on an inner wall of the chamber. The sputtering system is one of DC magnetron sputter and RF sputter. In addition, the inducing system comprises a booster for boosting AC utility power; and an AC-DC converter for rectifying and back-pressuring the AC voltage boosted by the booster and providing the grid with the negative DC voltage.

In addition, the vacuum system comprises: a pressure sensor for sensing the pressure in the process chamber; and a pressure controlling unit for controlling the vacuum system in order to control the pressure sensed by the pressure sensor in the process chamber to be the appropriate pressure.

In the present invention, the organic material is selected between the hydrocarbon of gas state and the hydrocarbon of liquid state. The hydrocarbon of gas state is one of methane, ethane, propane, and butane, and the hydrocarbon of liquid state are one of hexane and benzene.

In the present invention, the organo-metallic compound precursor is provided as the metal ion and the organic material, and the organo-metallic compound precursor is one of Li (acetate), $(CH_3)_3Al$, $(C_2H_5)_3Al$, $(C_4H_9)_3Al$, $(CH_3)_3Bi$, $(C_2H_5)_3Sb$, $(C_3H_7)_3Sb$, Ag(trifluoroacetate), Ag(acetate), $(C_2H_5O)_4Si$, $(C_2H_5)_3SiH$, $(CH_3)_4Sn$, $(C_2H_5)_4Sn$, $Cu(hfac)_2$, Cu(acac), Cu(DPM), (hfac)Cu(l)MP, (Hfac)Cu(I)(DMB), $(COD)Pt(CH_3)_2$, $Pt(CH_3)_2(CH_3NC)_2$, $Pd(allyl)_2$, $Ni(C_5H_5)_2$, $Ni(CO)_4$, and $Pt(hfac)_2$.

The metal ion is provided by sputtering the metal to ionize, and the organic material is provided after selecting one of the organic material of gas state and of liquid state.

The specimen on which the metal ion and the radical ion are coated is at least one of polymer resin, metal, ceramic, paper, and fiber.

The surface specific resistance of the metal film formed by the metal ion and the radical ion ranges $10^{-1}$~$10^8$ $\Omega$, and it can be applied to prevent static electricity and to shield the electromagnetic wave.

The chemical vapor deposition system at ambient temperature using ECR according to the present invention comprises: 1) ECR system; 2) the sputtering system for providing the ECR system with the metal ion; 3) a system for supplying organic material or organo-metallic compound which provides the organic material of gas phase or of liquid phase; and 4) the inducing system for inducing the metal ion and the radical ion on the substrate.

The ECR system comprises the vacuum system, a microwave system, components related to the magnetic field, and devices for automation of processing. As shown in FIG. 1, the microwave system comprises: a generator 20 (product of Astex, US (model S-100), the maximum output is 1 kW, the stability is 0.1%, and the ripple is not more than 1%) for generating microwave; a directional coupler 22 for inducing the microwave to a chamber 39 by changing the direction and a model of the microwave and generating even plasma; a wattmeter 24 connected to the directional coupler 22 as a branch for measuring the output of incident wave and reflection wave; an attenuator 23 for attenuating the microwave inputted into the wattmeter 24; an isolator 25 for blocking the reflection wave returning to the generator 20; a circulator/artificial load 21 for preventing damage caused by the returning of the reflection wave to the generator 20; a circulator 26; a 3-stub type tuner 28 for microwave tuning; and a symmetric plasma coupler 29.

In addition, the waveguide 30 is connected from the generator 20 to the symmetric plasma coupler 29, made using the copper, and has the function of transmitting the microwave effectively by being coated specially.

In the ECR system, the magnetic field forms a resonant layer, seals the plasma, and controls the plasma movement along with a flux line, and thereby the function of system is controlled. Therefore, the high current density of higher than $3A/mm^2$ is needed because the generated resonance characteristic, and there is needed a cooling device for preventing deterioration of the insulating material. A permanent magnet or an electromagnet is used as a first and a second magnet 35 and 37.

Also, the vacuum system required in the ECR system adopts a low pressure discharge method, and therefore, the vacuum system comprises a turbomolecular pump 71, a roots blower 72, and a rotary pump 75. And a chemical trap 73 or a filter 74 are added for removing toxic substance included in the gas discharged from the process chamber 10.

In addition, a throttle valve 70 is mounted on a front end of the turbomolecular pump 71, a baratron gauge 60 is mounted for sensing the pressure in the process chamber 10, and the throttle valve 70 is controlled by a valve controlling unit 65.

The valve controlling unit 65 controls the throttle valve 70 to maintain an appropriate pressure by sensing the pressure in the process chamber 10 through the baratron gauge 60.

An injection gas 32 provided into the ECR chamber 39 of the ECR system can be one of the oxidized gas, deoxidized gas, and inert gas. In addition, the gas is provided into the ECR chamber 39 in which the ECR phenomenon happens through a first mass flow meter 33. And, the first and second magnets 35 and 37 of 2.5 kW and 5 kW respectively are mounted on an upper and a lower ends of the ECR chamber 39, and a viewing window is formed on a center part to identify the status of the plasma.

In case that the electromagnet is used as the first and the second magnets 35 and 37, an electromagnet coil is made using a copper tube having empty inner space, and cooling water is provided into the inner space to cool down the heat generated when the system is operated. The magnetic field of the electromagnet is distributed differently toward an axial direction and a radius direction according to distances for a predetermined electric current.

Also, a structure of cylindrical shape made using the quartz is installed in the ECR chamber 39 to prevent the plasma from being contaminated by the attachment of the impurities which are attached on the wall of the ECR chamber.

In addition, the process chamber 10 in which the surface modification of the substrate is made is connected to a lower end of the ECR system, that is, to the lower end of the ECR chamber 39.

2) the sputtering system is a device for discharging the metal ion, that is, the sputtering gun. A target 56 installed in the process chamber 10 is sputtered using a sputter 55 of DC magnetron method or RF sputtering method in order to discharge the metal ion, and thereby the metal ion is provided.

3) in the system for supplying the organic material, methane, propane, or the gas phase material 40 such as the gas phase organo-metallic precursor are provided through the second mass flow meter 41, which controls the supplying amount. In the case of the liquid phase organic material such as a liquid hydrocarbon of the liquid phase organo-metallic compound precursor, these are provided by bubbler 44 having a contact temperature function in order to provide liquid phase organic material using the supplied gas 42 (the gas is the same as the injection gas 32) which is weighed and provided through the third mass flow meter.

4) the inducing system for inducing the metal ion and the radical ion on the substrate 15 comprises an electric power 50, a booster trans 51 for boosting the AC voltage into 15,000 Volt (electric current of 20 mA), and an AC-DC converter 52 for rectifying the AC voltage which is boosted by the booster trans 51 and back pressuring. The negative DC voltage rectified by the AC-DC converter 52 induces the metal ion and the radical ion on the substrate 15.

The AC-DC converter 52 rectifies using four rectifier diodes, the voltage is charged into four condensers having 471 pF/30 kV capacity, and the DC voltage of about 60 kV, four times as the inputted value in the four condensers, is generated entirely.

An anticipatory wave of voltage generated is not a square wave generated in the pulse bias, but a DC negative potential including a few percent of ripple ratio formed by negative potential curve of 60 Hz.

The organo-metallic compounds are decomposed into the positive and negative ions in the ECR area. That is, the metal ions become mainly the positive ions representing electric charge, and the hydrocarbon radicals are decomposed and changed into the negative ions. When a cycle current representing the negative charge is provided from the inducing system to the grid to which is installed around the substrate, the density of the metal positive ions is rapidly increased around the substrate. The grid 16 is installed inside the process chamber 10 and around the substrate, and uses a mesh constituting the metal such as stainless steel. The wave type of negative potential connected to the grid can be applied by negative DC high voltage or the cycle half-wave type negative potential (pulse voltage), and ranges from −0.1 to about −2.0 kV according to the present invention. In case that the amount of metal positive ions which are increased rapidly around the substrate are larger than the amount of vapor, the metal film is deposited on the surface of the substrate by a heterogeneous reaction which is more stable in energy than the vapor phase homogeneous reaction. The hydrocarbon negative ions decomposed and generated by the ECR plasma generate a plasma polymerization by reacting with free radicals formed on the surface of the substrate. And finally, a film in which the metal and the carbonized film are compounded is formed on the surface of the substrate.

In the present invention, the negative potential applied to the grid is changed to control the positive ion density and the negative ion density around the substrate, and consequently, the conductivity of the composite film can be controlled.

The fabrication of metal composite film according to the present invention will be described with reference to accompanying figures.

Embodiment 1

The ECR microwave power is 700W, the electric current supplied to the first magnet 170A (24V), and the electric current supplied to the second magnet 37 is 120A (17V), and thereby the ECR condition of 875 Gauss is formed on the upper and lower electromagnets by superposition principle of electromagnetic field. The pressure of the process chamber 10 is maintained to be 25 mtorr, the DC voltage applied to the grid is maintained to be −10 kV, and the pressure in the bubbler 44 is maintained to be 200 torr as $Cu(hfac)_2$, which is the precursor of the organo-metal. In addition, the flows of the argon and hydrogen range 0~100 sccm respectively. In the above conditions, the PET of 100×100 mm is located on the substrate 15, and deposited at ambient temperature for 30 minutes.

The surface specific resistance of the specimen on which the copper thin film is deposited is measured using ASTM D257, and then, the surface specific resistance is changed from $10^{12}$~$10^{14} \Omega/cm^2$ (before the deposition) to $10^{0}$~$10^{8} \Omega/cm^2$. In addition, the change of the surface specific resistance according to the ratio of the argon and hydrogen is shown in following table 1.

TABLE 1

| Ratio of $H_2/Ar$ | Surface specific resistance ($\Omega$) | Average value of the surface specific resistance ($\Omega$) |
|---|---|---|
| 0.00 | $10^8$ | $10^8$ |
| 0.25 | 83, 60, 60, 50 | 63.25 |
| 0.50 | 34.5, 50, 33, 65, 46, 44.2 | 45.45 |
| 0.75 | 9.0, 6.5, 9.2, 8.7, 9.9 | 9.11 |
| 1.00 | 7.2, 6.8, 9.5, 7.2, 9.0, 9.8, 8.8, 9.5 | 8.5 |
| 1.50 | 5, 5.8, 7.5, 7.2, 5.1, 5.1, 4.7 | 5.8 |
| 2.00 | 5, 4.8, 5.1, 4.5 | 5 |

Embodiment 2

In case that the supplying ratio of the hydrogen and the argon is 0.5, the microwave power is changed from 700 W to 200 W in the same conditions of the first embodiment except the microwave power value. The surface specific resistance is increased from 45.45$\Omega$ to 0.68 M$\Omega$. The change of the surface specific resistance according to the change of the microwave power is shown in Table 2.

TABLE 2

| Microwave power (W) | Ratio of $H_2/Ar$ | Surface specific resistance ($\Omega$) | Average value of surface specific resistance ($\Omega$) |
|---|---|---|---|
| 200 | 0.5 | $9.4 \times 10^4$, $8 \times 10^4$, $5.8 \times 10^4$, $5 \times 10^4$ | $6.8 \times 10^4$ |
| 700 | 0.5 | 34.5, 50, 33, 65, 46, 44.2 | 45.45 |

Embodiment 3

In case that various polymer resin, silicon wafer, paper, and fiber are used as the basis material which is the object of coating in the condition same as that of the embodiment 1, the metal thin film is coated and the surface modification of the basis material can be performed to have conductivity. The kinds of the basis materials and the average value of the surface specific resistance according to the surface modification are shown in Table 3.

TABLE 3

| Kinds of basis materials | Average value of surface specific resistance ($\Omega$) |
|---|---|
| Polymer resin | |
| PE | 69.6 |
| PET | 71.1 |
| PP | 68.02 |
| PTEE | 66.35 |
| PVC | 72.82 |
| Paper (A4 size) | 75.5 |
| Fiber (coffon) | 480 |

TABLE 3-continued

| Kinds of basis materials | Average value of surface specific resistance (Ω) |
|---|---|
| Silicon wafer (100) | 52.5 |
| Silicon wafer (111) | 75.2 |

Embodiment 4

In case that the supplying rate of the hydrogen and the argon is 0.5, conditions except the first and second magnets 35 and 37 are same as those of the first embodiment, and the electric current supplied to the coil is changed in order to change the intensity of the magnetic field. Then, the surface specific resistance is increased from 45Ω to 0.68 MΩ. The changes of the surface specific resistance according to the amount of electric current supplied to the first and second magnets are shown in Table 4.

TABLE 4

| First magnet (A) | Second magnet (A) | Surface specific resistance (Ω) | Average value of surface specific resistance (Ω) |
|---|---|---|---|
| 170 | 120 | 34.5, 50, 33, 65, 46, 44.2 | 45.45 |
| 140 | 110 | 90, 65, 68, 56, 58 | 84.25 |
| 120 | 100 | 270, 305, 408, 520, 520, 480 | 417 |

Embodiment 5

The copper(Cu) is mounted in the process chamber 10 as the target 56 instead of supplying the organo-metallic precursor as in the first embodiment, is sputtered using the sputter 55, and the n-hexane which is the hydrocarbon is supplied as the speed of 10 cc/min to deposit the copper thin film for 10 minutes. The surface specific resistance of the copper thin film is reduced, and the deposition speed is increased as 20 times. The change of the surface specific resistance according to the method for supplying the metal ion is shown in Table 5.

TABLE 5

| Supplying method of metal ion | Average value of surface specific resistance (Ω) | Deposition speed of metal thin film (nm/min) |
|---|---|---|
| Cu (hfac)$_2$ | 52 | 5 |
| Cusputtering (RF power 200 W) | 0.3 | 200 |

COMPARING EXAMPLE 1

As comparing the copper thin film fabricated by the present invention to the surface of the thin film fabricated by the sputter, copper metallic crystal can be hardly shown on the surface fabricated by the ECR/sputter compounded type chemical deposition at ambient temperature as an amorphous form, however, the thin film fabricated using the sputter is covered with the copper metallic crystals.

COMPARING EXAMPLE 2

As comparing the cross section of copper thin film deposited on the polymer resin according to the present invention to that of the thin film deposited by the sputter, the cross section of the present invention is coupled to the polymer resin firmly and the boundary of the copper and the polymer resin is uncertain. However, the bounding force of the cross section of the thin film fabricated by the sputtering method is gradually weakened as going upward, and the boundary between the cross section of the polymer resin and the copper thin film is shown vividly.

COMPARING EXAMPLE 3

Figure 3:
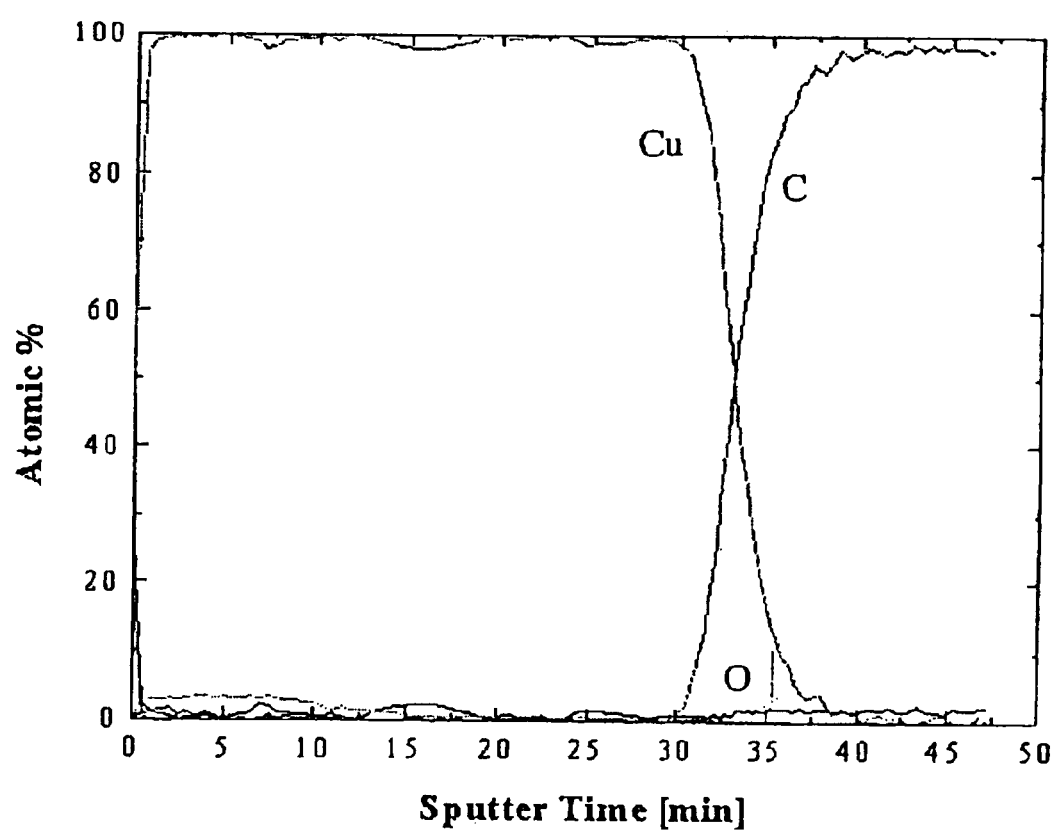
FIG. 3 is a graph showing an Auger characteristic of a copper metal thin film fabricated by a conventional sputter.

The composition of the metal composite film which is chemically deposited on the polymer resin is analyzed by Auger in order to compare. As the result of the analyzing, the composition of the thin film according to the present invention comprises Cu 74%, C 25%, and O 1%, and the resistance of the thin film is 69.6Ω/cm. However, the thin film fabricated by the sputter comprises Cu 100% as shown in FIG. 3. Accordingly, the result supports the result of comparing example 2.

COMPARING EXAMPLE 4

Figure 4:
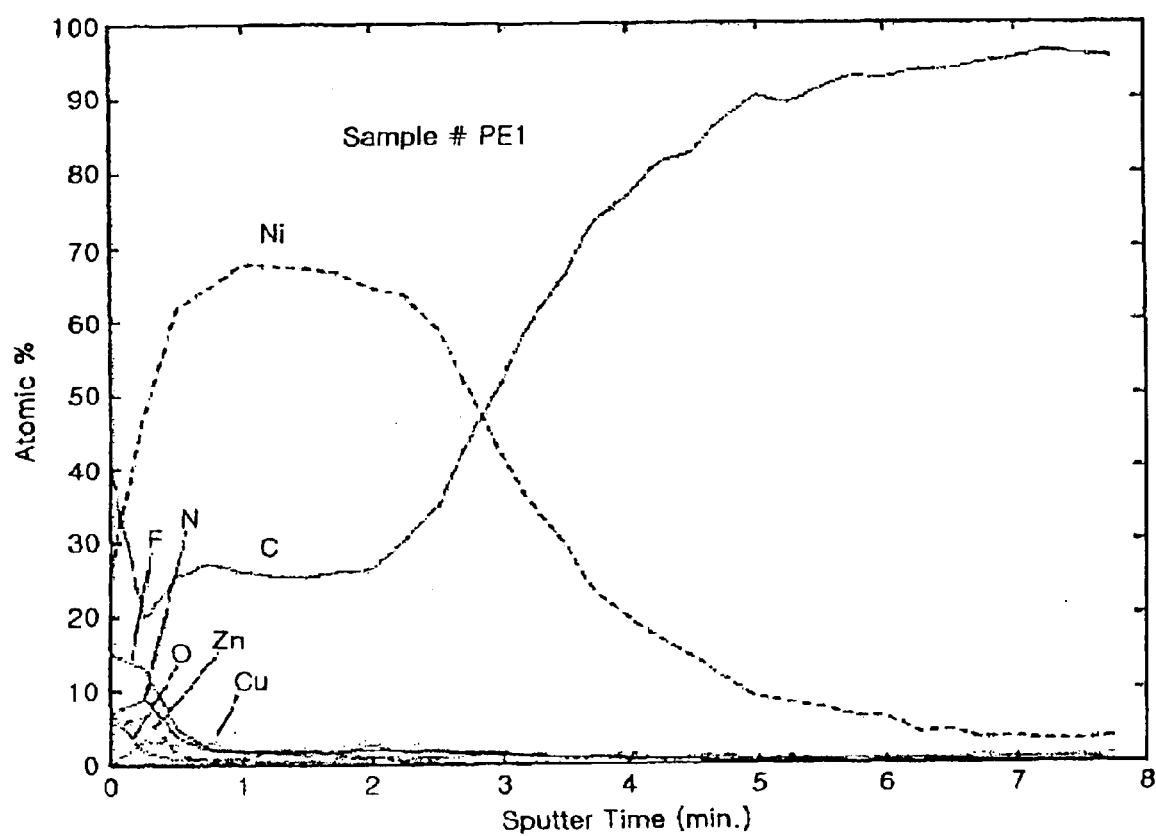
FIG. 4 is a graph showing an Auger characteristic of nickel metal thin film fabricated when the nickel is charged in an ECR plasma etching zone and an organic material is supplied on a side surface of a process chamber.

FIG. 4 is showing a result that the composition of the metal composite film deposited on the polymer resin by locating the nickel on the plasma etching zone and providing paraxylene organic material independently, and composition of the film comprises Cu 3.5%, C 25%, F 3%, and O 2.5% included in the precursor, and Zn 2%, and Ni 63% which are sputtered from an electrode material. And the resistance of the thin film is 69.6Ω/cm.

As described above, according to the present invention, a multicomponent metal thin film can be deposited on the polymer surface at ambient temperature using ECR plasma chemical deposition method, and detailed effects of the present invention will be described as follows.

1. The metal thin film formed by the chemical deposition of the present invention has superior film characteristic that the adhesion between the substrate and the metal thin film is very firm when it is compared to the metal thin film fabricated using the sputter or the ion beam of the conventional art.

2. The ionizing energy is high due to the ECR condition, and therefore the plasma of high density is formed. In addition, the chemical deposition speed can be increased by coupling with the sputter which is the device for supplying the ionized metal. Also, if a plurality of sputter guns are installed in the chamber, formation of the multicomponent metal thin film and the composition controlling can be performed easily.

3. The deposition area and the plasma zone are not divided with each other, and the film growth mechanism is the chemical reaction which is different from that of the conventional art, that is, the impacts of the metal particles, and thereby the change of the physical property such as the distortion of the substrate or the mechanical strength lowering is not generated.

4. The conductivity of the deposited metal film can be controlled by controlling plasma power, composition and kinds of the metal included in the film, and the density of the organic material.

5. The multicomponent metal film which is constructed chemically can be deposited, and therefore, the metal thin film of new function and of high performance requiring a special function can be made.

6. According to the method for fabricating the metal thin film on the surface of the polymer resin by the chemical deposition using ECR of the present invention, the plasma is generated out of the chamber and injected into the chamber, and therefore, it is convenient for enlarging the substrate which is the object of coating and constructing successive processes. Thereby, it can be easily applied to a mass product equipment.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a metal composite film using ECR plasma coupled with a negative DC bias comprising:

a step of providing a gas in plasma form into a chamber in which reaction is made using ECR characteristic;

a step of providing the chamber with a metal ion and an organic material which is supplied by selecting one between a vapor state and a liquid state;

a step of generating an organic material ion and a radical ion by reacting the metal ion and the organic material with the plasma; and a step of inducing the organic material ion and the radical ion on a surface of a specimen and chemically compounding them at an ambient temperature, wherein the organic material ion and the radical ion are induced on the surface of said specimen by a negative pulsed DC bias supplied to a grid over said specimen.

2. The method of claim 1, wherein the organic material is selected between a hydrocarbon of vapor state and a hydrocarbon of liquid state.

3. The method of claim 2, wherein the hydrocarbon of vapor state is selected one among methane, ethane, propane, and butane, and the hydrocarbon of liquid state is selected one among hexane, benzene, toluene, p-Xylene, ethylbenzene, styrene, 1,1,1,5,5,5-hexafluoro-2,4-pentanedionato {H(fac)}, and tetrahydrofuran (THF).

4. The method of claim 1, wherein the supplying of the metal ion and the organic material is made by oragano-metallic compound precursor.

5. The method of claim 4, wherein the organo-metallic compound is selected one among Li (acetate), $(CH_3)_3Al$, $(C_2H_5)_3Al$, $(C_4H_9)_3Al$, $(CH_3)_3Bi$, $(C_2H_5)_3Sb$, $(C_3H_7)_3Sb$, Ag(trifluoroacetate), Ag(acetate), $(C_2H_5O)_4Si$, $(C_2H_5)_3SiH$, $(CH_3)_4Sn$, $(C_2H_5)_4Sn$, $Cu(hfac)_2$, Cu(acac), Cu(DPM), (hfac)Cu(I)MP, (Hfac)Cu(I)(DMB), $(COD)Pt(CH_3)_2$ $(CH_3NC)_2$, $Pd(allyl)_2$, $(Ni(C_5H_5)_2$, $Ni(CO)_4$, and $Pt(hfac)_2$.

6. The method of claim 1, wherein the supplying of the metal ion and the organic material is made by sputtering the metal to change it into metal ion, and the organic material is supplied by selecting one between the organic materials of gas state and of liquid state.

7. The method of claim 1, wherein the specimen on which the metal ion and the radical ion are coated is selected one among polymer resin, metal ceramic, paper, and fiber.

8. The method of claim 1, wherein an specific resistance of metal thin film surface formed by the metal ion and the radical ion ranges $10^{-1} \sim 10^8 \Omega$.

* * * * *